United States Patent
Han et al.

(10) Patent No.: US 9,337,383 B2
(45) Date of Patent: May 10, 2016

(54) LIGHT EMITTING DEVICE

(75) Inventors: Dae Seob Han, Seoul (KR); Yong Tae Moon, Seoul (KR); Jong-In Shim, Seoul (KR)

(73) Assignees: LG Innotek Co., Ltd., Seoul (KR); Industry-University Cooperation Foundation Hanyang University Erica Campus, Ansan (KR)

( * ) Notice: Subject to any disclaimer, the term of this patent is extended or adjusted under 35 U.S.C. 154(b) by 374 days.

(21) Appl. No.: 13/404,615

(22) Filed: Feb. 24, 2012

(65) Prior Publication Data

US 2012/0319079 A1  Dec. 20, 2012

(30) Foreign Application Priority Data

Jun. 14, 2011  (KR) ................. 10-2011-0057373

(51) Int. Cl.
- *H01L 33/06* (2010.01)
- *H01L 33/04* (2010.01)
- *H01L 33/32* (2010.01)

(52) U.S. Cl.
CPC ............... *H01L 33/06* (2013.01); *H01L 33/04* (2013.01); *H01L 33/32* (2013.01)

(58) Field of Classification Search
CPC .......... H01L 33/06; H01L 33/32; H01L 33/04
USPC ...................... 257/85, 94, E33.016, E33.049
See application file for complete search history.

(56) References Cited

U.S. PATENT DOCUMENTS

| 5,583,878 A * | 12/1996 | Shimizu | B82Y 20/00 372/45.01 |
|---|---|---|---|
| 5,737,350 A * | 4/1998 | Motoda | B82Y 20/00 372/45.01 |
| 6,175,123 B1 * | 1/2001 | Kano | B82Y 20/00 257/13 |
| 2004/0256611 A1 * | 12/2004 | Kim | B82Y 20/00 257/13 |
| 2007/0085097 A1 * | 4/2007 | Kim | B82Y 20/00 257/94 |
| 2007/0297476 A1 * | 12/2007 | Ito | B82Y 20/00 372/45.01 |
| 2008/0023690 A1 * | 1/2008 | Moon | B82Y 20/00 257/13 |
| 2008/0308787 A1 * | 12/2008 | Lee | H01L 33/32 257/13 |
| 2009/0057691 A1 * | 3/2009 | Kim | H01L 33/06 257/89 |
| 2009/0278113 A1 * | 11/2009 | Chung | H01L 33/32 257/13 |
| 2009/0310640 A1 * | 12/2009 | Sato | H01L 21/02389 372/45.011 |
| 2011/0095263 A1 * | 4/2011 | Son | H01L 33/06 257/13 |
| 2011/0198562 A1 * | 8/2011 | Moon | H01L 33/007 257/13 |
| 2012/0236891 A1 * | 9/2012 | Johnson | B82Y 20/00 375/45.01 |

FOREIGN PATENT DOCUMENTS

| CN | 1937267 A | 3/2007 |
|---|---|---|
| JP | 2000-174328 A | 6/2000 |

* cited by examiner

*Primary Examiner* — Marvin Payen
*Assistant Examiner* — Jeremy Joy
(74) *Attorney, Agent, or Firm* — KED & Associates LLP

(57) ABSTRACT

Disclosed is a light emitting device including a first conductive type semiconductor layer; a second conductive type semiconductor layer disposed on the first conductive type semiconductor layer; and an active layer disposed between the first conductive type semiconductor layer and the second conductive type semiconductor layer, the active layer comprising quantum well layers and quantum barrier layers, wherein each of the quantum well barrier layers comprises first barrier layers and a second barrier layer disposed between the first barrier layers, and an energy bandgaps of the second barrier layer is larger than energy bandgaps of the quantum well layers and smaller than energy bandgaps of the first barrier layers.

18 Claims, 8 Drawing Sheets

LIGHT EMITTING DEVICE

CROSS-REFERENCE TO RELATED APPLICATION

This application claims priority under 35 U.S.C. §119 from Korean Application No. 10-2011-0057373 filed in Korea on Jun. 14, 2011, the subject matter of which is hereby incorporated in its entirety by reference as if fully set forth herein.

TECHNICAL FILED

Embodiments may relate to a light emitting device.

BACKGROUND

With thin film growth technology and device material development, a light emitting device such as light emitting diode using III-V or II-VI group compound semiconductor materials or a laser diode may realize various colors including red, green and blue and such a light emitting device may realize a white light having good luminescence efficiency by using a phosphor material or combining colors. Also, the light emitting device may have advantages of low power consumption, a semipermanent life span of usage, a rapid response speed and good eco-friendliness, compared with a conventional light source such as a fluorescent lamp and an incandescent lamp.

As a result, the light emitting device has been increasingly applied to a transmission module of optical communication means, a light emitting diode backlight substituting for a cold cathode fluorescence lamp (CCFL) composing a backlight of a liquid crystal display (LCD) device, a white light emitting diode lighting device, a headlight of a vehicle and a streetlight.

SUMMARY

Accordingly, the embodiments may provide a light emitting device capable of improving internal quantum efficiency and an output power.

In one embodiment, a light emitting device includes a first conductive type semiconductor layer; a second conductive type semiconductor layer disposed on the first conductive type semiconductor layer; and an active layer disposed between the first conductive type semiconductor layer and the second conductive type semiconductor layer, the active layer comprising quantum well layers and quantum barrier layers, wherein each of the quantum well barrier layers comprises first barrier layers and a second barrier layer disposed between the first barrier layers, and an energy bandgap of the second barrier layer is larger than energy bandgaps of the quantum well layers and smaller than energy bandgaps of the first barrier layers. The first barrier layers may be layers where an electron or a hole is tunneled.

The energy bandgaps of the first barrier layers may be larger than or identical to an energy bandgap of the first conductive type semiconductor layer and an energy bandgap of the second conductive type semiconductor layer. The energy bandgaps of the first barrier layers may be smaller than an energy bandgap of the first conductive type semiconductor layer and an energy bandgap of the second conductive type semiconductor layer. The energy bandgaps of the first barrier layers may be identical to each other. The energy bandgaps of the first barrier layers may be uniform. The energy bandgap of the second barrier layers may be identical to each other. The energy bandgaps of the second barrier layers may be uniform.

In another embodiment, a light emitting device includes a first conductive type semiconductor layer; a quantum well layer disposed on the first conductive type semiconductor layer, with indium; a quantum well protection layer disposed on the quantum well layer; a principal quantum barrier layer disposed on the quantum ell protection layer, with indium, wherein an indium content of the principal quantum barrier layer is smaller than an indium content of the quantum well layer; a principal quantum barrier protection layer disposed on the principal quantum barrier layer; and a second conductive type semiconductor layer disposed on the principal quantum barrier protection layer.

An indium content of the quantum well protection and an indium content of the principal barrier protection layer may be smaller than the indium content of the principal quantum barrier layer.

Each of the quantum well layers may have an empirical formula of $In_xGa_{1-x}N$ ($0.14 \leq x \leq 0.15$). Each of the quantum well protection layer and the principal quantum barrier protection layer may have an empirical formula of $In_xGa_{1-x}N$ ($0 \leq x < 0.05$). The principal quantum barrier layer may have an empirical formula of $In_xGa_{1-x}N$ ($0.05 \leq x \leq 0.1$).

The thickness of the quantum well protection layer may be 1 nm or less. The thickness of the principal quantum barrier protection layer may be 5 nm or less. The principal barrier layer may be a non-luminous layer.

The quantum well protection layer and the principal quantum barrier protection layer may be layers where an electrode or a hole is tunneled.

The light emitting device may further include a substrate disposed under the first conductive type semiconductor layer; a conductive layer disposed on the second conductive type semiconductor layer; a first electrode disposed on the first conductive type semiconductor layer; and a second electrode disposed on the conductive layer. Or, the light emitting device may further include an ohmic layer disposed under the second conductive type semiconductor layer; a reflection layer disposed under the ohmic layer; a first electrode disposed on the first conductive type semiconductor layer; and a passivation layer disposed on a lateral surface of the light emitting structure.

In a further embodiment, a light emitting device package includes a package body; first and second lead frames disposed on the package body, with being electrically independent from each other; and the light emitting device according to the claim 1 which is electrically connected with the first lead frame and the second lead frame.

According to the embodiment, internal quantum efficiency and an output power may be enhanced.

BRIEF DESCRIPTION OF THE DRAWINGS

Arrangements and embodiments may be described in detail with reference to the following drawings in which like reference numerals refer to like elements and wherein:

FIG. 14b is a sectional view illustrating a light source of the display device shown in FIG. 14a.

DETAILED DESCRIPTION

Hereinafter, embodiments will be described with reference to the annexed drawings.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

The size of each element is exaggerative, omitted or illustrative schematically. Also, the size of each element may not reflect the substantial size necessarily. The same reference numbers will be used throughout the drawings to refer to the same or like parts. Hereinafter, embodiments will be described with reference to the annexed drawings.

Figure 1:
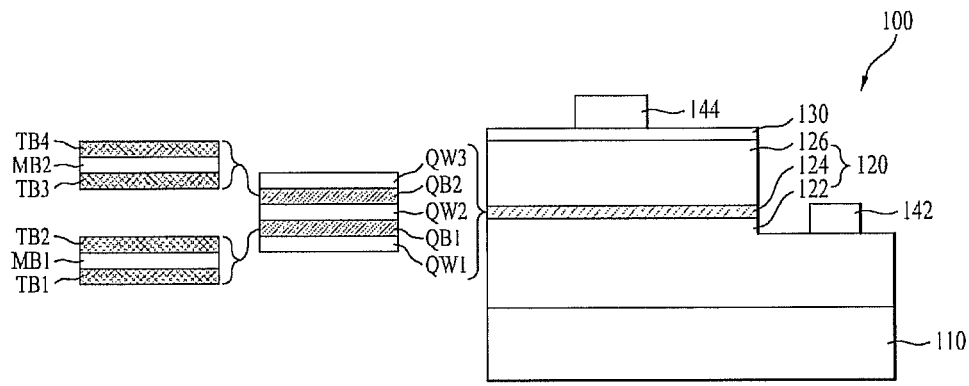
FIG. 1 is a sectional view illustrating a light emitting device.

FIG. 1 is a sectional view illustrating a light emitting device 100 according to an embodiment. In reference to FIG. 1, the light emitting device 100 may include a substrate 110, a light emitting structure 120, a conductive layer 130, a first electrode 142 and a second electrode 144.

The substrate 110 may support the light emitting structure 120. The substrate 110 may be a sapphire substrate, a silicon (Si) substrate, a zinc oxide (ZnO) substrate or a nitride semiconductor substrate or a template substrate having at least one of GaN, InGaN, AlGaN and AlInGaN multilayered thereon.

The light emitting structure 120 may be disposed on the substrate 110 and it may generate light.

The light emitting structure 120 may include a first conductive type semiconductor layer 122, an active layer 124 and a second conductive type semiconductor 126. Also, the second conductive type semiconductor layer 126, the active layer 124 and the first conductive type semiconductor layer 122 may be partially etched to partially expose the first conductive type semiconductor layer 122.

To reduce a difference of a lattice constant and a thermal expansion coefficient between the substrate 110 and the light emitting structure 120, a buffer layer (not shown) may be disposed between the substrate 110 and the light emitting structure 120. Also, an undoped semiconductor layer (not shown) may be disposed between them to enhance crystallinity of the first conductive type semiconductor layer 122.

At this time, the buffer layer may grow at a low temperature and it may be a GaN or AlN layer. However, the embodiment is not limited thereto. The undoped semiconductor may be identical to the first conductive type semiconductor layer 122, except having lower electro conductivity, because an n-dopant is not doped.

The conductive layer 130 may reduce total reflection and it may have good light transmissivity. Because of that, extraction efficiency of the light emitted from the active layer 124 toward the second conductive type semiconductor layer 126 may be increased.

The conductive layer 130 may be formed of a transparent conductive oxide, for example, at least one of indium tin oxide (ITO), tin oxide (TO), indium zinc oxide (IZO), indium tin zinc oxide (ITZO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au and Ni/$IrO_x$/Au/ITO, in a single or multi layer.

The first electrode 142 may be disposed on the exposed first conductive type semiconductor layer 122 and the second electrode 144 may be disposed on the conductive layer 130.

The first conductive type semiconductor layer 122 may be disposed on the substrate 110 and it may be a nitride semiconductor layer. The first conductive type semiconductor layer 122 may be formed of a semiconductor material having an empirical formula: $In_xAl_yGa_{(1-x-y)}N$ ($0 \leq x \leq 1$, $0 \leq y \leq 1$, $0 \leq x+y \leq 1$), for example, a selected material from GaN, AlN, AlGaN, InGaN, InN, InAlGaN and AlInN and an n-dopant such as Si, Ge, Sn, Se and Te may be doped therein.

The active layer 124 may be disposed on the first conductive type semiconductor layer 122.

The second conductive type semiconductor layer 126 may be disposed on the active layer 124 and it may be nitride semiconductor layer. The second conductive type semiconductor layer 126 may be formed of a semiconductor material having a following empirical formula: $In_xAl_yGa_{(1-x-y)}N$ ($0 \leq x \leq 1$, $0 \leq y \leq 1$, $0 \leq x+y \leq 1$), for example, a selected from GaN, AlN, AlGaN, InGaN, InN, InAlGaN and AlInN and a p-dopant such as Mg, Zn, Ca, Sr and Ba may be doped thereon.

The active layer 124 may generate light by using an energy determined by an energy generated when an electron injected via the first conductive semiconductor layer 122 meets a hole injected via the second conductive type semiconductor layer 126 after that.

The active layer 124 may include a semiconductor material having an empirical formula: $In_xAl_yGa_{1-x-y}N$ ($0 \leq x \leq 1$, $0 \leq y \leq 1$, $0 \leq x+y \leq 1$) and it may have a multi quantum well structure including quantum well layers QW1 to QWn (n≥2 and 'n' is a natural number) and quantum barrier layers QB1 to QBm (m≥1 and 'm' is a natural number) that are layered alternatively.

The quantum well layers QW1 to QWn (n≥2 and 'n' is a natural number) may be disposed, spaced apart a predetermined distance from the first conductive type semiconductor layer 122 toward the second conductive type semiconductor layer 126. The quantum barrier layers QB1 to QBm (m≥1 and 'm' is a natural number) may be disposed between two neighboring ones of the quantum well layers QW1 to QWn (n≥2 and 'n' is a natural number), respectively.

Figure 2:
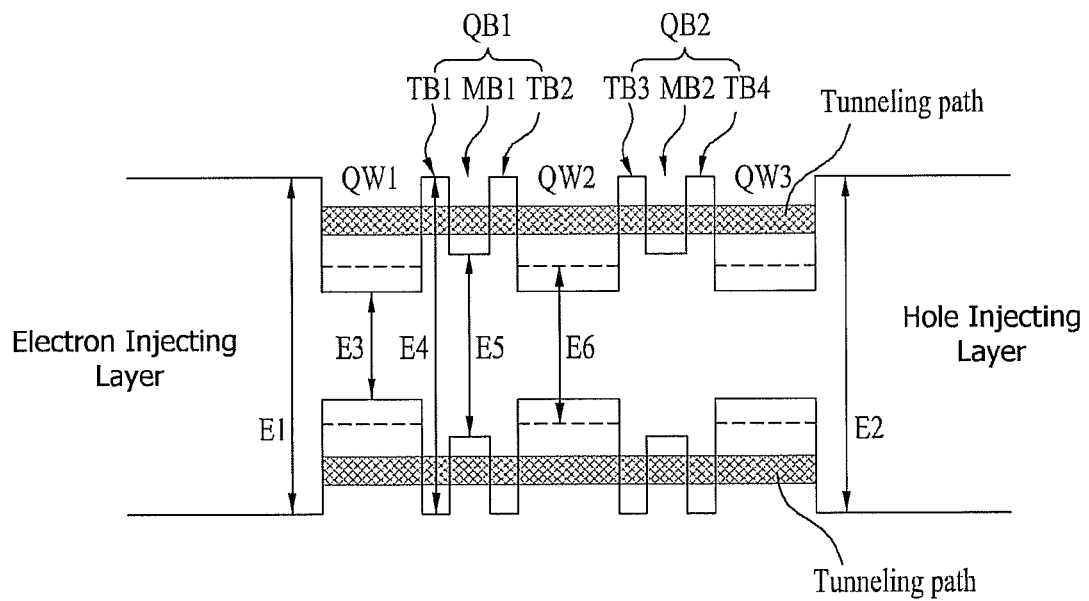
FIG. 2 is illustrating an energy bandgap of an active layer shown in FIG. 1.

FIG. 2 illustrates an energy bandgap of the active layer 124 shown in FIG. 1. Here, an electron injecting layer may be the first conductive type semiconductor layer 122 and a hole injecting layer may be the second conductive type semiconductor layer 126. The active layer 124 may be disposed between the electron injecting layer and the hole injecting layer.

In reference to FIG. 2, the active layer 124 may include a plurality of quantum well layers QW1 to QWn and 'n' is a natural number) and quantum barrier layers QBm (m≥1 and 'm' is a natural number). The energy bandgap of the quantum barrier layers QB1 to QBm (m≥1 and 'm' is a natural number) may be larger than the energy bandgap of the quantum well layers QW1 to QWn (n≥2 and is a natural number).

Each of the quantum barrier layers QBm (m≥1 and 'm' is a natural number) may include a tunneling barrier layers (TB1 and TB2 or TB3 and TB4, for example) and a principal quantum barrier layer (MB1 or MB2, for example) disposed between the tunneling barrier layers.

For example, the active layer 124 may include first to third quantum well layers QW1 to QWn (n=3) and first and second quantum barrier layers QB1 and QBm (m=2). The first quantum well layer QW1, the second quantum well layer QW2 and the third quantum well layer QW3 may be sequentially disposed adjacent to the electron injecting layer. The first quantum barrier layer QB1 may be disposed between the first quantum well layer QW1 and the second quantum well layer QW2 and the second quantum barrier layer QB2 may be disposed between the second quantum well layer QW2 and the third quantum well layer QW3.

The first quantum well barrier layer QB1 may include a first tunneling barrier layer TB1, a first principal quantum barrier layer mB1 and a second tunneling barrier layer TB2. The second quantum barrier layer QB2 may include a third tunneling barrier layer TB3, a second principal quantum barrier layer MB2 and a fourth tunneling barrier layer TB4.

The energy bandgap (E4) of the tunneling barrier layers TB1 to TBm (m=4) may be larger than the energy bandgaps (E3) of the quantum well layers QW1 to QWn (n=3, for example) and identical to or larger than the energy bandgap (E1) of the electron injecting layer and the energy bandgap (E2) of the hole injecting layer. However, the embodiment is not limited thereto. according to another embodiment, the energy bandgaps (E4) of the tunneling barrier layers TB1 to TBm (m=4, for example) may be smaller than the energy bandgap (E1) of the electron injecting layer and the energy bandgap (E2) of the hole injecting layer.

The energy bandgaps of the tunneling barrier layers TB1 to TBm (m=4) may be identical to each other and they may be uniform. However, the embodiment is not limited thereto. Also, the energy bandgaps (E5) of the principal quantum barrier layers (MB1 and MB2, for example) may be larger than the energy bandgaps (E3) of the quantum well layers QW1 to QWn (n=3, for example) and smaller than the energy bandgaps (E4) of the tunneling barrier layers TB1 to TBm (m=4, for example) (E3<E5<E4). The energy bandgaps (E5) of the principal quantum barrier layers (MB1 and MB2, for example) may be identical to each other and they may be uniform. However, the embodiment is not limited thereto.

The tunneling barrier layers TB1 to TBm (m=4, for example) may be barrier layers enabling the electron and the hole to transport by tunneling effect. The electron and the hole may be transported smoothly along a tunneling path configured of the quantum well layers QW1 to QWn (n=3, for example), the tunneling barrier layers TB1 to TBm (m=4, for example) and the principal quantum barrier layers (MB1 and MB2).

The quantum well layers QW1 to QWn (n=3, for example), principal quantum barrier layers (MB1 and MB2), and the tunneling barrier layers TB1 to TBm (m=4, for example) may include indium (In). At least principal quantum barrier layers (MB1 and MB2) out of the tunneling barrier layers TB1 to TBm (m=4, for example) or the principal quantum barrier layers (MB1 and MB2) may include indium (In).

An indium content of the principal quantum barrier layers MB1 and MB2 may be larger than an indium content of the tunneling barrier layers TB1 to TBm (m=4, for example). Also, an indium contact of the principal quantum barrier layers MB1 and MB2 and the tunneling barrier layers TB1 to TBm (m=4, for example) may be smaller than an indium contact of the quantum well layers.

For example, each of the quantum well layers QW1 to QWn (n=3, for example) may have an empirical formula: $In_xAl_yGa_{1-x-y}N$ (0.14≤x0.15 and y=0) and the thickness of each quantum well layer may be 2 nm~4 nm.

For example, each of the tunneling barrier layers TB1 to TBm (m=4, for example) may have an empirical formula: $In_xAl_yGa_{1-x-y}N$ (0≤x<0.05 and y=0). The thickness of each tunneling barrier layer may be 1 nm or less.

For example, each of the principal quantum barrier layers MB1 and MB2 may have an empirical formula: $In_xAl_yGa_{1-x-y}N$ (0.05≤x≤0.1 and y=0). The thickness of each principal quantum barrier layer may be 5 nm or less.

The principal quantum barrier layers (MB1 and MB2, for example) may be used as barrier layers not as well layers contributing to luminescence. To perform the function of the barrier layers, the principal quantum barrier layers (MB1 and MB2, for example) may satisfy following conditions.

First of all, the energy bandgaps (E5) of the principal quantum barrier layers (MB1 and MB2, for example) may be at least larger than a difference between a first energy level of the electron and a first energy level of the hole in the quantum well layers (QW1 to QW3, for example). because of that, when the supplied electron and hole are located at the energy level of the quantum well layers, the supplied electron and hole cannot be bound enough to contribute luminescence. Here, the first energy level may refer to the most stabilized or lowest energy level of the electron and hole in the quantum well layers (QW1 to QW3, for example).

Next, the tunneling barrier layers TB1 to TBm (m=4, for example) have to be thin enough to generate the tunneling of the electron and hole. This may mean that the tunneling barrier layers TB1 to TBm (m=4, for example) are transparent with respect to the electron and hole. In other words, the electron and hole may be smoothly transmissive through the tunneling barrier layers TB1 to TBm (m=4, for example) and that the electron and hole cannot be bound in the principal quantum barrier layers (MB1 and MB2, for example).

Figure 3:
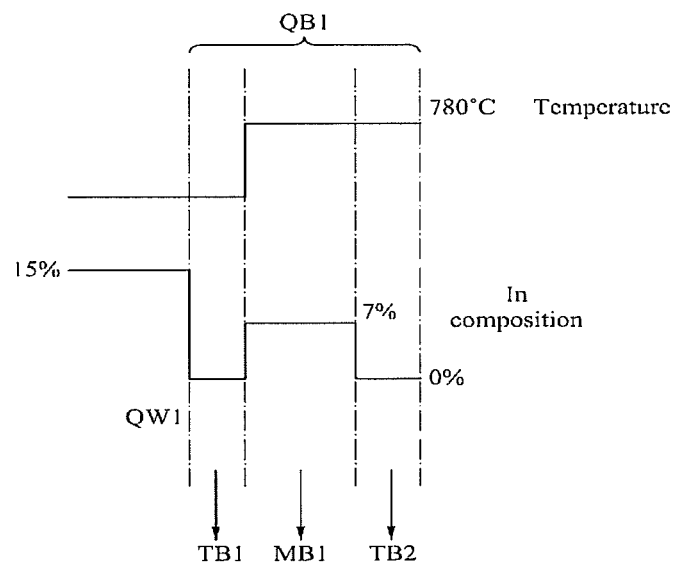
FIG. 3 illustrating an embodiment configured to grow a first quantum well layer and a first quantum barrier layer shown in FIG. 2.

FIG. 3 illustrates an embodiment configured to grow the first quantum well layer QW1 and the first quantum barrier layer QB1 shown in FIG. 2. in reference to FIG. 3, the first quantum well layer QW1 may be growing until it has a thickness of 2 nm~4 nm and until it has an indium content of 14%~15% at a growth temperature of 700° C.~800° C.

After the growth of the first quantum well layer QW1 is complete, the first tunneling barrier layer TB1 may be growing until it has a thickness of 1 nm or less to have an indium content of less than 5% at the same growth temperature (for example, 700° C.~800° C.) as that of the first quantum well layer QW1.

After the growth of the first tunneling barrier layer TB1 is complete, the first principal quantum barrier layer MB1 may be growing until it has a thickness of 5 nm or less to have an indium content of 5%~10% at a higher growth temperature (for example, 780° C.) than the growth temperature (for example, 700° C.~800° C.) of the first tunneling barrier layer TB1. The reason why the growth temperature is heightened is to improve crystallinity quality of the quantum well layer.

After the growth of the first principal quantum barrier layer MB1 is complete, the second tunneling barrier layer TB2 may be growing until to have a thickness of 1 nm or less and to have an indium content of less than 5% at the same growth temperature (for example, 780° C.) as that of the first principal quantum barrier layer MB1. The indium contents of the first tunneling barrier layer (TB1) and the second tunneling barrier layer TB2 may be 0% and the embodiment is not limited thereto.

When the first principal quantum barrier layer MB1 is growing at the high temperature, the first tunneling barrier layer TB1 may be employed to block the indium included in the quantum well layer QW1 from flowing toward the first quantum barrier layer QB1, only to maintain the crystallinity quality of the first quantum well layer QW1. Because of that, the first tunneling barrier layer TB1 may be referenced to as 'quantum well protection layer'.

In addition, the second tunneling barrier layer TB2 may be employed to block the indium included in the first principal quantum barrier layer MB1 from flowing toward the second quantum well layer QW2, only to maintain the indium content of the first principal quantum barrier layer MB1 and to maintain the crystallinity quality of the first principal quantum barrier layer MB1. The second tunneling barrier layer TB2 may be referenced to as 'principal quantum barrier protection layer'.

In addition, the thickness of the first tunneling barrier layer TB1 and the thickness of the second tunneling barrier layer TB2 may be 1 nm or less. Because of that, the tunneling of the electron and hole may be performed smoothly. The hole injected from the hole injection layer to the active layer 124 may transport by the tunneling, only to transport to a quantum well layer distant from the hole injecting layer. Because of that, the holes injected from the hole injecting layer to the active layer 124 may be uniformly transported and distributed into the quantum well layers QW1 to QW3.

As a result, the embodiment may enable the quantum well layers QW1 to QW3 to be luminous uniformly and the internal quantum efficiency (IQE) and output power of the light emitting device 100 may be enhanced.

Figure 5:
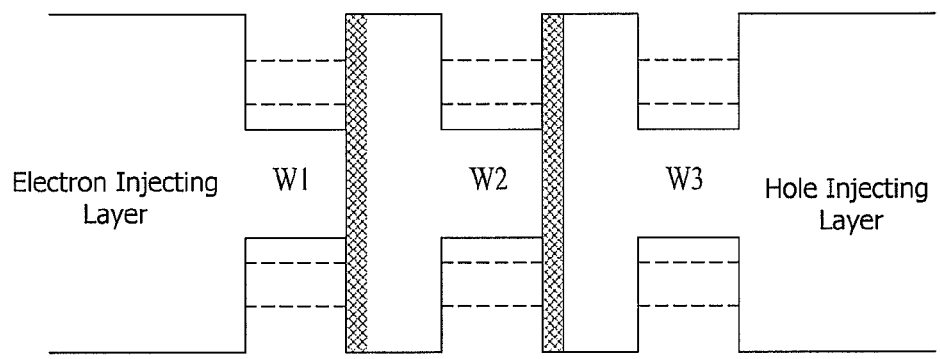
FIG. 5 is illustrating an energy gap of a multi quantum well structure provided in a conventional active layer.

FIG. 5 illustrates an energy bandgap of a multi quantum well structure provided in a conventional active layer. In reference to FIG. 5, quantization energy levels in conventional quantum well layers (W1 to W3, for example) may be possessed only by a preset amount of electrons or holes according to quantum mechanics.

As a result, if the amount of the electrons or holes injected from the electron injecting layer or the hole injecting layer is large, there might be surplus electrons or surplus holes not bound in the quantum well layers W1 to W3 effectively.

Such surplus electrons or surplus holes might lapse in the active layer or leak outside the active layer, without involved in generating the light. The injected currents might be increased and non-luminous loss might be increased accordingly. As a result, internal quantum efficiency of the active layer might be deteriorated.

Especially, because mobility of the hole is low when the current is injected, the injection of the hole cannot be performed smoothly and uniformly to the entire of the multi quantum well structure. As a result, radiation might be mainly generated in the last one (W3) of the quantum wells nearest to the hole injecting layer. Uniform radiation fails to be generated in an entire area of the active layer and the luminous efficiency of the light emitting device might be reduced accordingly.

Figure 4:
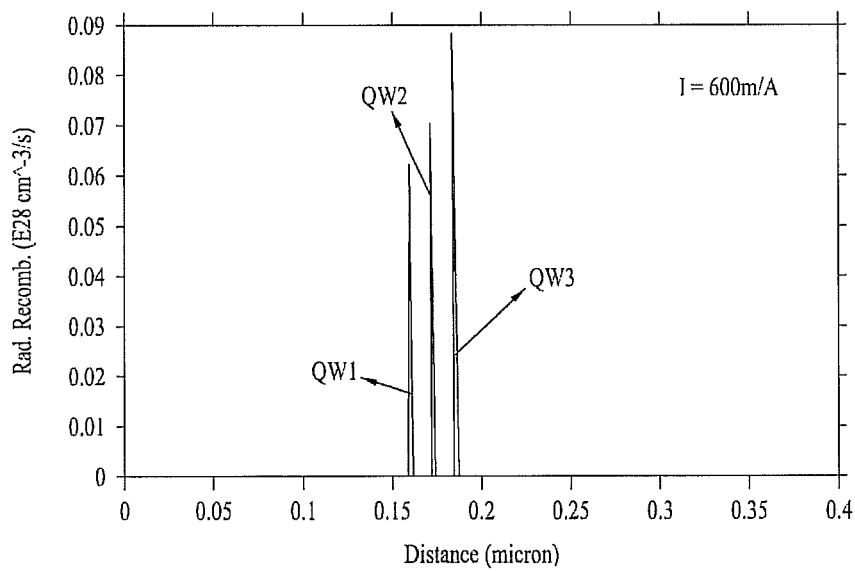
FIG. 4 is illustrating radiative recombination of a multi quantum well structure according to an embodiment, when a current is injected.
Figure 6:
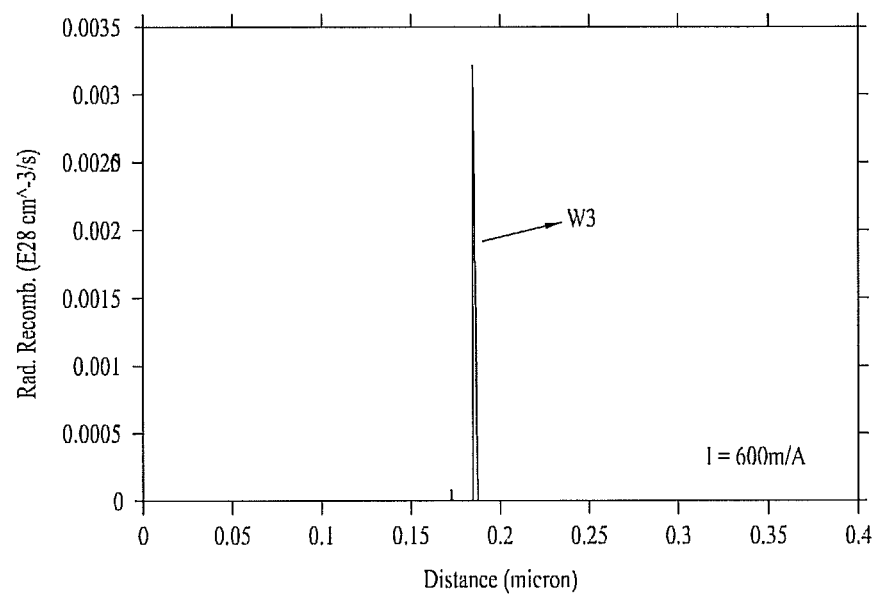
FIG. 6 is illustrating radiative recombination of the multi quantum well structure provided in the conventional active layer when a current is injected.

FIG. 4 illustrates a radiative recombination of the multi quantum well (MQW) according to the embodiment, when a current is injected. FIG. 6 illustrates radiative recombination of a multi quantum well of a conventional active layer, when a current is injected. In reference to FIGS. 4 and 6, when a current is injected (for example, I=600 A/m and A/m is 'Ampere per meter), radiation may be generated in the last quantum well layer (W3) in the conventional multi quantum well structure.

However, according to the embodiment, the holes may be transported into the quantum well layers (QW1 to QW3, for example) uniformly and distributed uniformly by the tunneling. Because of that, radiation may be generated by the radiative recombination in each of the three quantum well layers (QW1 to QW3, for example). As a result, the embodiment may enhance the internal quantum efficiency and output power.

Figure 7:
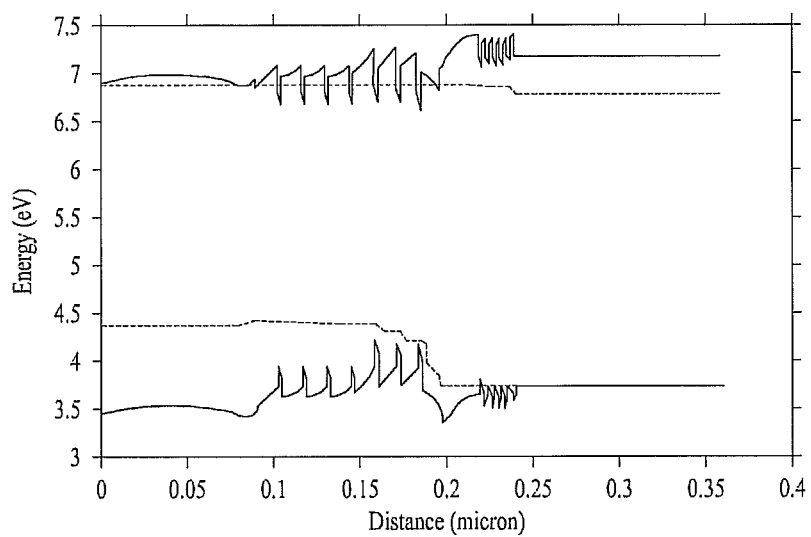
FIG. 7 is an energy bandgap diagram of the conventional multi quantum well structure when the current is injected.
Figure 8:
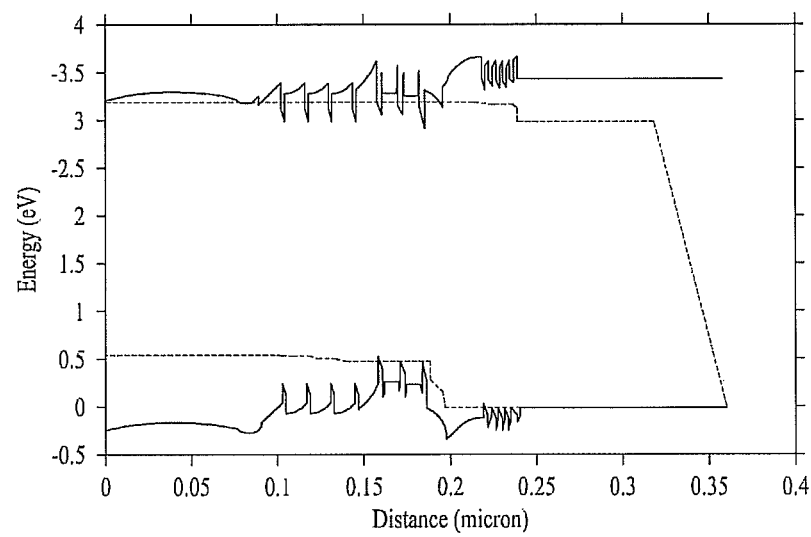
FIG. 8 is an energy band diagram of the multi quantum well structure according to the embodiment when the current is applied.
Figure 9:
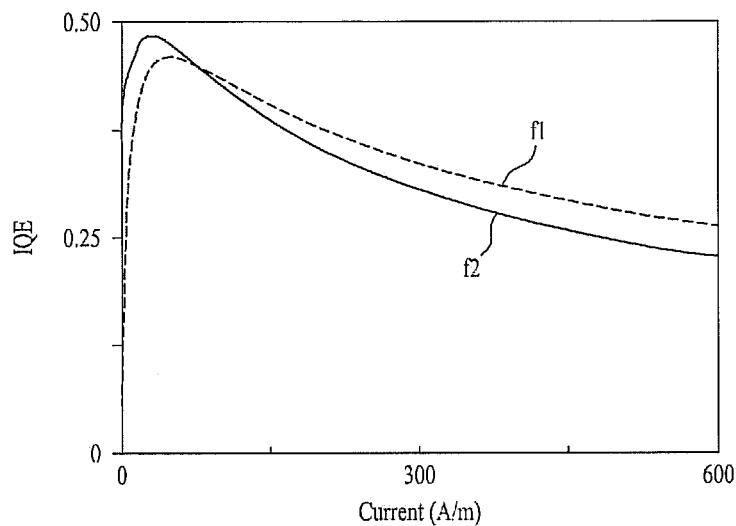
FIG. 9 is illustrating internal quantum efficiency of the multi quantum well structure according to the embodiment.
Figure 10:
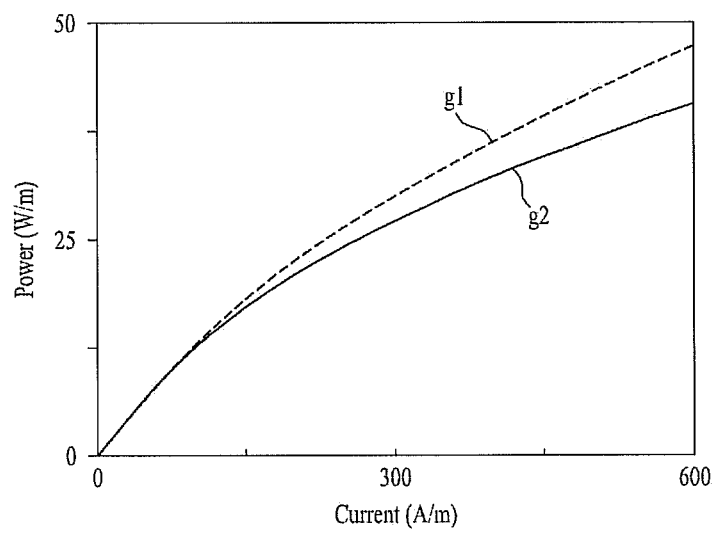
FIG. 10 is illustrating an output power characteristic of the multi quantum well structure according to the embodiment.

FIG. 7 is an energy band diagram of the conventional multi quantum well structure when the current is injected. FIG. 8 is an energy band diagram of the multi quantum well structure according to the embodiment when the current is applied. FIG. 9 is illustrating internal quantum efficiency of the multi quantum well structure according to the embodiment. FIG. 10 is illustrating an output power characteristic of the multi quantum well structure according to the embodiment. Here, 'f1' may refer to internal quantum efficiency (IQE) of the embodiment and 'f2' may refer to internal quantum efficiency (IQE) of the conventional light emitting device. 'g1' may refer to an output power of the embodiment and 'g2' may refer to an output power of the conventional light emitting device.

In reference to FIGS. 7 to 10, the internal quantum efficiency (f1) of the embodiment may be larger than the internal quantum efficiency (f2) of the conventional light emitting device, when a current (I=600 A/m, for example) is injected.

The output power (g1) of the embodiment may be larger than the output power (g2) of the conventional light emitting device, when the current (I=600 A/m, for example) is injected. As a result, the output power and the internal quantum efficiency of the embodiment may be improved when the current is injected.

Figure 11:
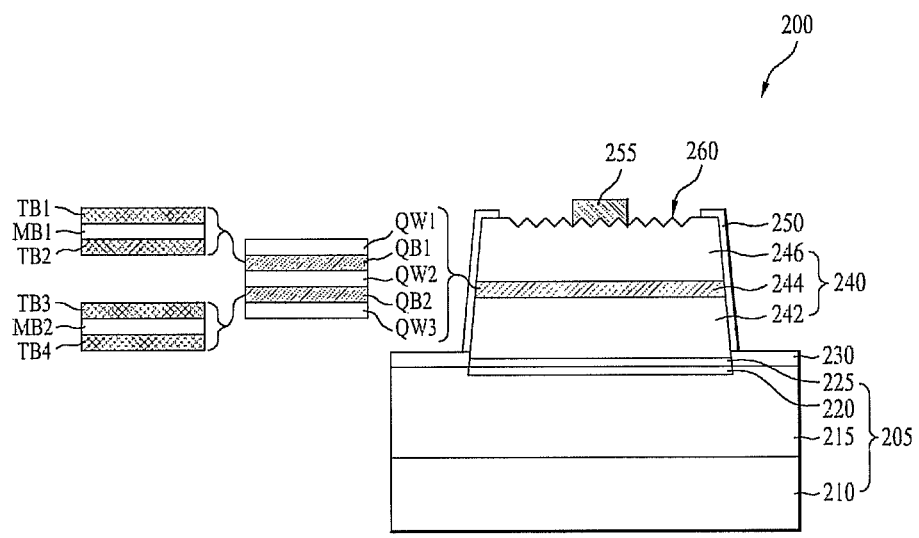
FIG. 11 is illustrating a light emitting device according to another embodiment.

FIG. 11 illustrates a light emitting device 200 according to another embodiment. In reference to FIG. 11, the light emitting device 200 may include a second electrode layer 205, a protection layer 230, a light emitting structure 240, a passivation layer 250 and a first electrode 255.

The second electrode layer 205 may include a support layer 210, an adhesive layer 215, a reflective layer 220 and an ohmic layer 225. The support layer 210 may support the light emitting structure 240 and it may supply an electric power to the light emitting structure 240, together with the first electrode 255. The support layer 210 may be formed of conductive material, for example, at least one of Cu, Au, Ni, Mo, Cu—W, or a carrier wafer (Si, Ge, GaAs, ZnO and SiC, for example).

The adhesive layer 215 may be disposed on the support layer 210 and it may be formed under the reflective layer 220 as a bonding layer. The adhesive layer 215 may in contact with the reflective layer 220 and the ohmic layer 225, to adhere the reflective layer 220 and the ohmic layer 225 to the support layer 210. The adhesive layer 215 may include a barrier metal or bonding metal. For example, it may include at least one of Ti, Au, Sn, Ni, Cr, Ga, In, Bi, Cu, Ag and Ta.

The reflective layer 220 may be disposed on the adhesive layer 215. The reflective layer 220 may reflect light incident thereon from the light emitting structure 240 and it may enhance light extraction efficiency accordingly. The reflective layer 220 may be formed of a metal material including at least one of AG, Ni, Al, Rh, Pd, Ir, Ru, Mg, Zn, Pt, Au and Hf or alloy of metal materials. Also, the reflective layer 220 may be formed in a multilayer structure, using a transmissive conductive material such as IZO, IZTO, IAZO, IGZO, IGTO, AZO and ATO. For example, IZO/Ni, AZO/Ag, IZO/AG/Ni and AZO/Ag/Ni may be multilayered to form the reflective layer 220. The reflective layer 220 may be employed to increase luminous efficiency and it may not be provided necessarily.

The ohmic layer 225 may be disposed on the reflective layer 220 and the ohmic layer 225 may in ohmic-contact with a second conductive type semiconductor layer 242 of the light emitting structure 240, to enable the electric power supplied to the light emitting structure 240 smoothly. The ohmic layer 225 may use a transmissive conductive layer and a metal material selectively and it may be realized by using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au and Ni/$IrO_x$/Au/ITO, in a single or multi layer.

The ohmic layer 225 may be employed to enable carriers injected to the second conductive type semiconductor layer 242 smoothly and it may not be formed necessarily. For example, the ohmic layer 225 may not be provided independently and the material used for the reflection layer 150 may be selected from materials capable of ohmic-contacting with the second conductive type semiconductor layer 242, such that the reflective layer 220 may in ohmic-contact with the second conductive type semiconductor layer 242.

The protection layer 230 may be disposed on the second electrode layer 205 and the protection layer 230 may reduce a surface between the light emitting structure 240 and the adhesive layer 215 from being separated, which might result in deterioration of reliability of the light emitting device 200.

The protection layer 230 may be disposed on an edge region of a top surface of the adhesive layer 215. If the adhesive layer 215 is not formed, the protection layer 230 may be disposed on an edge region of a top surface of the support layer 210.

The protection layer 230 may be formed of a material having conductivity or non-conductivity. For example, the conductive protection layer may be formed of a transparent conductive oxide or a metal material including at least one of Ti, Ni, Pt, Pd, Rh, Ir and W, for example. The non-conductive protection layer may be formed of a material having lower electro conductivity than the reflective layer 220 and the ohmic layer 225, a material capable of forming Schottky-contact with the second conductive type semiconductor layer 242 or an electric insulative material. For example, the non-conductive protection layer may be formed of ZnO or $SiO_2$.

The light emitting structure 240 may be disposed on the second electrode layer 205 and the light emitting structure 240 may have a second conductive type semiconductor layer 242, an active layer 244 and a first conductive type semiconductor layer 246 which are multilayered on the second electrode layer 205 sequentially.

The active layer 244 may include the quantum well layers QW1 to QWn (n≥2 and 'n' is a natural number) mentioned in reference to FIG. 2, the quantum barrier layers (QB1 to QBm (m≥1 and 'm' is a natural number) having the tunneling barrier layers (TB1 to TB4, for example) and the principal quantum barrier layers (MB1 and MB2, for example).

As mentioned above, radiation may be generated in each of the quantum well layers (QW1 to QW3, for example) in the light emitting device 200 according to this embodiment, when the current is injected. Because of that, internal quantum efficiency may be enhanced and an output power may be enhanced.

The passivation layer 250 may be formed on lateral surfaces of the light emitting structure 240 to protect the light emitting structure 240 electrically and the embodiment is not limited thereto. The passivation layer 250 may be formed of an insulation material, for example, $SiO_2$, $SiO_x$, $SiO_xN_y$, $Si_3N_y$ and $Al_2O_3$.

Roughness 260 may be formed in a top surface of the first conductive type semiconductor layer 246 to enhance light extraction efficiency. The first electrode 255 may be disposed on a top surface of the light emitting structure 240 and the roughness 260 may be formed or not formed in the first conductive type semiconductor layer 246 disposed under the first electrode 255.

Figure 12:
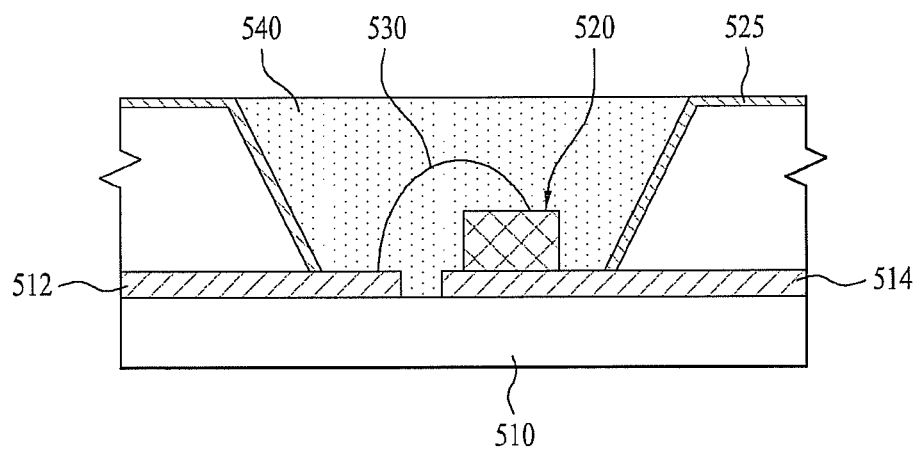
FIG. 12 illustrating a light emitting device package according to an embodiment.

FIG. 12 illustrates a light emitting device package according to an embodiment. In reference to FIG. 12, the light emitting device package may include a package body 510, a first metal layer 512, a second metal layer 514, a light emitting device 520, a reflection plate 525, a wire 530 and a resin layer 540.

The package body 510 may have a cavity formed in a predetermined region thereof. At this time, a lateral wall of the cavity may be inclined. The package body 510 may be formed of a silicon-based wafer level package, a silicon substrate, a silicon carbide (SiC) substrate or an aluminum nitride (AlN) substrate, with good insulation and thermal conductivity. The package body 510 may have a plurality of substrates multilayered sequentially. This embodiment is not limited to the material, structure and shape of the package body mentioned above.

Considering heat sink or mounting of the light emitting device, the first metal layer 512 and the second metal layer 514 may be disposed on a surface of the package body 510, electrically separable from each other. The light emitting device 520 may be electrically connected with the first metal layer 512 and the second metal layer 514. At this time, the light emitting device 520 may be the light emitting device 100 or 200 shown in FIG. 1 or 11.

For example, the second electrode layer 205 of the light emitting device 200 may be electrically connected with the second metal layer 514 and the first electrode 255 may be electrically connected with the first metal layer 512 by the wire 530.

For example, although not shown in FIG. 12, the first electrode 142 of the light emitting device 100 may be electrically connected with the first metal layer 512 and the second electrode 144 may be electrically connected with the second metal layer 514 by wires (not shown).

The reflection plate 525 may be formed on a lateral wall of the cavity formed in the package body 510 to make the light emitted from the light emitting device 520 directed toward a preset direction. The reflection plate 525 may be formed of a light reflective material, for example, metal coating or a metal piece.

The resin layer 540 may surround the light emitting device 520 located in the cavity of the package body 510, to protect it from the external environment. The resin layer 540 may be formed of a colorless transparent polymer resin material such as epoxy or silicon. The resin layer 540 may include phosphor to change the wavelength of the light emitted from the light emitting device 520. At least one of the light emitting devices according to the embodiments described above the light emitting device package may be mounted on the light emitting device package and this embodiment may not be limited thereto.

The light emitting device package according to the present invention may be arrayed on a substrate. As optical members, a light guide plate, a prism sheet and a diffusion sheet may be disposed on a luminous path of the light emitting device packages. Those light emitting device packages, the substrate and the optical members may be functioned as a light unit.

A further embodiment may be realized by a display device, a pointing device or a lighting system including the semiconductor light emitting device or the light emitting device package according to the embodiments. For example, the lighting system may include a lamp and a streetlamp.

Figure 13:
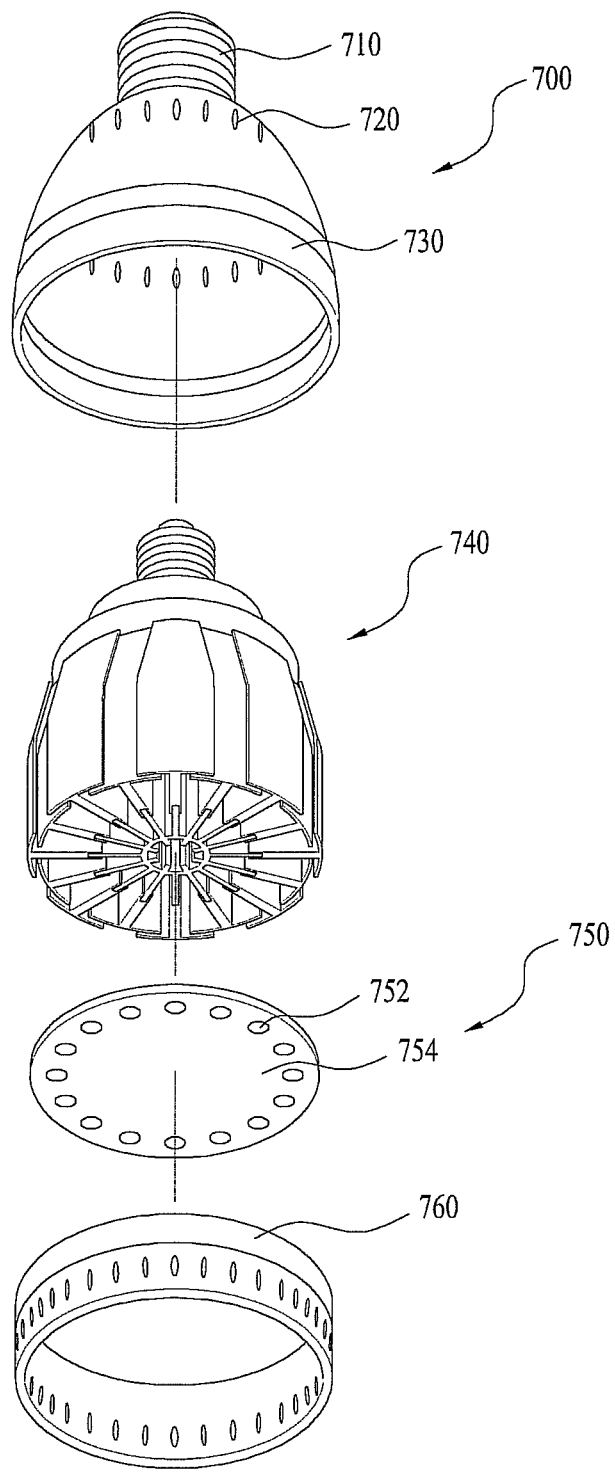
FIG. 13 is an exploded perspective view illustrating a lighting device according to an embodiment which includes the light emitting device package according to the embodiment.

FIG. 13 is an exploded perspective view illustrating a lighting device according to an embodiment that includes the light emitting device package according to the embodiments. In reference to FIG. 13, the lighting device according to this embodiment may include a light source 750 to emit light, a housing 700 to mount the light source 750 therein, a heat sink 740 to emit the heat of the light source 750, and a holder 760 to couple the light source 750 and the heat sink part 740 to the housing 700.

The housing 700 may include a socket coupling part 710 coupled to an electric socket (not shown) and a housing body part 730 connected to the socket coupling part 710 to mount the light source 750 therein. A single air-hole 720 may be formed through the housing body part 730.

A plurality of air holes 720 may be provided in the housing body part 730 of the housing 700. A single air hole may be provided or a plurality of air holes may be disposed along a radial direction. Rather than the radial arrangement, other various arrangements of the air holes may be possible.

The light source 750 may include a plurality of the light emitting modules 752 disposed on a circuit board 754. The circuit board 754 may be formed in a shape that is able to be inserted in an opening of the housing 700 and it may be formed of a material having a high thermal conductivity to transmit heat to the heat sink 740 which will be described in detail later.

The holder 760 may be provided under the light source and the holder 760 may include a frame and another air hole. Although not shown in the drawing, under the light source 750 may be provided optical members to diffuse, scatter or collect the light emitted from the light emitting device package 752 of the light source 750.

Figure 14A:
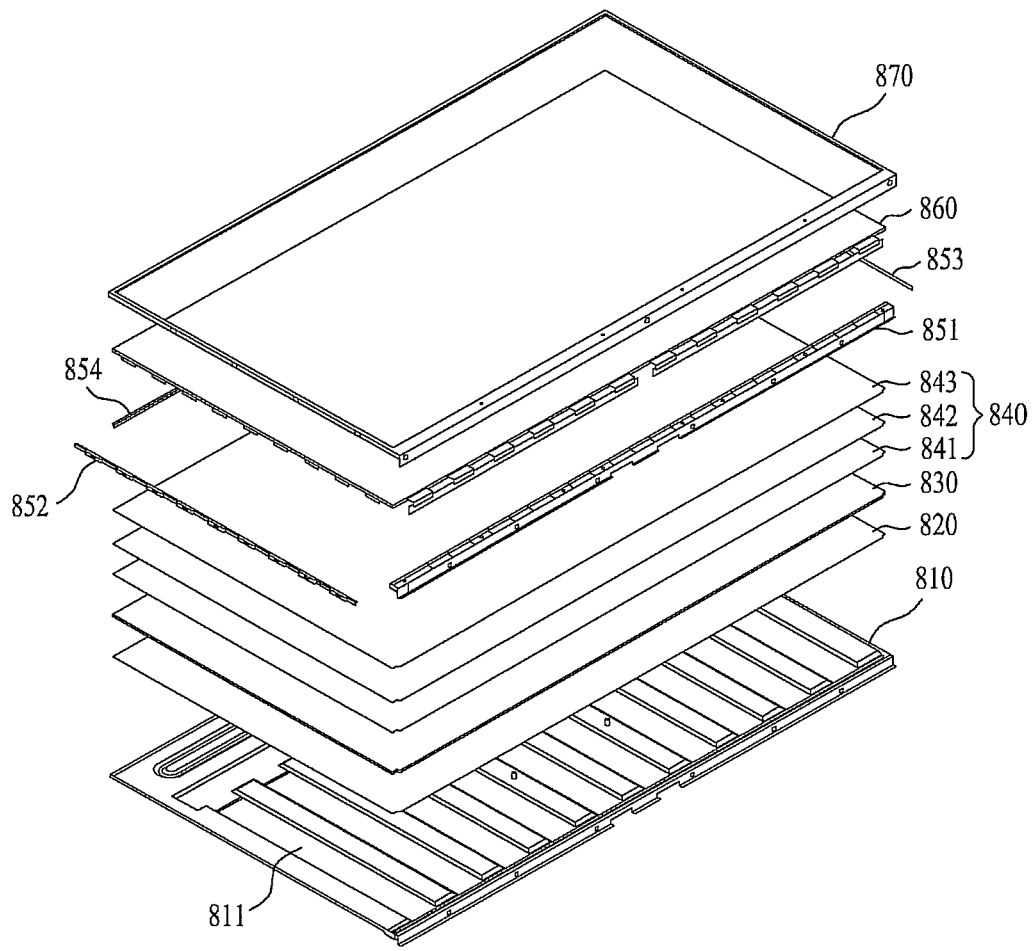
FIG. 14a is illustrating a display device according to an embodiment which includes the light emitting device package according to the embodiment.
Figure 14B:
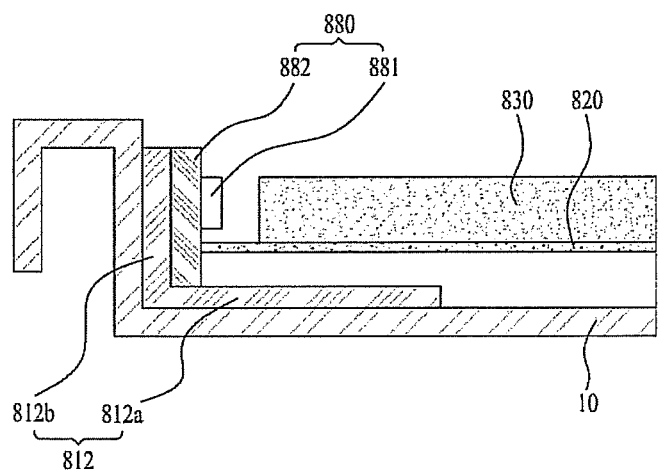

FIG. 14a illustrates a display device according to an embodiment, which includes the light emitting device package according to the embodiment. FIG. 14b is a sectional view of a light source provided in the display device shown in FIG. 14a.

In reference to FIGS. 14a and 14b, the display device according the embodiment may include a backlight unit, a liquid crystal display panel 860, a top cover 870 and a fixing member 850.

The backlight unit may include a bottom cover 810, a light emitting module 880 provided in a preset region of the bottom cover 810, a reflection plate 820 disposed in front of the bottom cover 810, a light guide plate 830 disposed in front of the reflection plate 820 to guide the light emitted from the light emitting module 880 toward a front of the display device, and an optical member 840 disposed in front of the light guide plate 830. The liquid crystal display device 860 may be provided in front of the optical member 840 and the top cover 870 may be provided in front of the liquid crystal display panel 860. The fixing member 850 may be disposed between the bottom cover 810 and the top cover 870 to fix the bottom cover 810 and the top cover 870 to each other.

The light guide plate 830 may guide the light emitted from the light emitting module 880 to be projected as a surface light source. The reflection plate 820 disposed behind the light guide plate 830 may reflect the light emitting from the light emitting module 880 toward the light guide plate 830, to enhance luminous efficiency. Here, the reflection plate 820 may be an independent element as shown in the drawing or it may be provided by coating a rear surface of the light guide panel 830 or a front surface of the bottom cover 810 with a material having a high reflectivity. Here, the reflection plate 820 may be formed of a material having a high reflectivity that is useable in an ultra-thin type such as polyethylene terephthalate (PET).

The light guide plate 830 may disperse the lights emitted from the light emitting module 880 to distribute the lights to an entire screen area of the liquid crystal display device uniformly. As a result, the light guide panel 830 may formed of a material having a high index of refraction and a high transmissivity such as polymethylemethacrylate (PMMA), polycarbonate (PC) or polyethylene (PE).

The optical member 840 may be provided on the light guide plate 830 to diffuse the light emitted from the light guide plate 830 at a preset angle. The optical member 840 may enable the light guided by the light guide plate 830 to be radiated toward the liquid crystal display panel 860 uniformly. As the optical member 840, an optical sheet such as a diffusion sheet, a prism sheet or a protection sheet may be selectively multilayered or a micro lens array may be used. At this time, a plurality of optical sheets may be used and the optical sheets may be formed of transparent resin such as acryl resin, polyurethane resin or silicon resin. A phosphor sheet may be provided in the prism sheet mentioned above, as mentioned above.

The liquid crystal display panel 860 may be provided in front of the optical member 840. Here, it is obvious that another type of display device requiring a light source may be provided, rather than the liquid crystal display panel 860. The reflection plate 820 may be disposed on the bottom cover 810 and the light guide plate 830 may be disposed on the reflection plate 820. The reflection plate 820 may be in direct contact with a heat sink member (not shown). The light emitting module 880 may include a light emitting device package 882 and a printed circuit board 881. The light emitting device package 882 may be mounted on the printed circuit board 881. Here, the light emitting device package 881 may be one of the embodiments mentioned above.

The printed circuit board 881 may be bonded on a bracket 812. Here, the bracket 812 may be formed of a predetermined material capable of fixing the light emitting device package 882 with high thermal conductivity rate. Although not shown in the drawings, a heat pad may be provided between the bracket 812 and the light emitting device package 882 to enable heat transmission performed smoothly. The bracket 812 may be formed in a "L" shape as shown in the drawing. A horizontal part 812a may be supported by the bottom cover 810 and a vertical part 812b may fix the printed circuit board 881.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive type semiconductor layer;
a second conductive type semiconductor layer disposed on the first conductive type semiconductor layer; and
an active layer disposed between the first conductive type semiconductor layer and the second conductive type semiconductor layer, the active layer comprising quantum well layers and quantum barrier layers,
wherein each of the quantum barrier layers includes first barrier layers and a second barrier layer disposed between the first barrier layers,
an energy bandgap of the second barrier layer is larger than energy bandgaps of the quantum well layers and the energy bandgap of the second barrier layer is smaller than energy bandgaps of the first barrier layers,
wherein a thickness of each of the first barrier layers is smaller than a thickness of the second barrier layer, and
wherein the thickness of the second barrier layer is 5 nm or less, and the thickness of each of the first barrier layers is 1 nm or less, and
wherein the energy bandgaps of the first barrier layers are larger than an energy bandgap of the first conductive type semiconductor layer, and the energy bandgaps of the first barrier layers are larger than an energy bandgap of the second conductive type semiconductor layer.

2. The light emitting device according to claim 1, wherein the electron and the hole are transported along a tunneling path configured of the quantum well layers, the first barrier layers and the second barrier layer.

3. The light emitting device according to claim 1, wherein the energy bandgaps of the first barrier layers are identical to each other.

4. The light emitting device according to claim 3, wherein the energy bandgaps of the first barrier layers are uniform.

5. The light emitting device according to claim 1, wherein the energy bandgap of the second barrier layers are identical to each other.

6. The light emitting device according to claim 5, wherein the energy bandgaps of the second barrier layers are uniform.

7. A light emitting device comprising:
a first conductive type semiconductor layer;
a quantum well layer disposed on the first conductive type semiconductor layer and including indium;
a quantum well protection layer disposed on the quantum well layer;
a principal quantum barrier layer disposed on the quantum well protection layer and including indium, wherein an indium content of the principal quantum barrier layer is less than an indium content of the quantum well layer;
a principal quantum barrier protection layer disposed on the principal quantum barrier layer; and
a second conductive type semiconductor layer disposed on the principal quantum barrier protection layer,
wherein a thickness of each of the quantum well protection layer and the principal quantum barrier protection layer is smaller than a thickness of the principal quantum barrier layer, and
wherein a thickness of the quantum well protection layer is 1 nm or less, and a thickness of the principal quantum barrier layer is 5 nm or less, and
wherein the energy bandgaps of the quantum well protection layer and the principal quantum barrier protection layer are larger than an energy bandgap of the first conductive type semiconductor layer, and the energy bandgaps of the quantum well protection layer and the principle quantum barrier protection layer are larger than an energy bandgap of the second conductive type semiconductor layer.

8. The light emitting device according to claim 7, wherein an indium content of the quantum well protection layer and an indium content of the principal quantum barrier protection layer are less than the indium content of the principal quantum barrier layer.

9. The light emitting device according to claim 7, wherein each of the quantum well layers has an empirical formula of $In_xGa_{1-x}N$ ($0.14 \le x \le 0.15$).

10. The light emitting device according to claim 7, wherein each of the quantum well protection layer and the principal quantum barrier protection layer has an empirical formula of $In_xGa_{1-x}N$ ($0 \le x < 0.05$).

11. The light emitting device according to claim 7, wherein the principal quantum barrier layer has an empirical formula of $In_xGa_{1-x}N$ ($0.05 \le x \le 0.1$).

12. The light emitting device according to claim 7, wherein the principal quantum barrier layer is a non-luminous layer.

13. The light emitting device according to claim 7, wherein the electron and the hole are transported along a tunneling path configured of the quantum well layers, the quantum well protection layer, the principal quantum barrier layer, and the principal quantum barrier protection layer.

14. The light emitting device according to claim 7, further comprising:
a substrate disposed under the first conductive type semiconductor layer;
a conductive layer disposed on the second conductive type semiconductor layer;
a first electrode disposed on the first conductive type semiconductor layer; and
a second electrode disposed on the conductive layer.

15. The light emitting device according to claim 7, further comprising:
an ohmic layer disposed under the second conductive type semiconductor layer;
a reflection layer disposed under the ohmic layer;
a first electrode disposed on the first conductive type semiconductor layer; and
a passivation layer disposed on a lateral surface of the light emitting structure.

16. A light emitting device package comprising:
a package body;
first and second lead frames disposed on the package body, with being electrically independent from each other; and
the light emitting device according to the claim 1 which is electrically connected with the first lead frame and the second lead frame.

17. The light emitting device according to claim 1, wherein an energy bandgap of the second barrier layer is larger than a difference between a first energy level of electrons and a first energy level of holes in the quantum well layers.

18. The light emitting device according to claim 1, wherein the first barrier layers are two layers, and the second barrier layer contacts each of the two layers of the first barrier layer.

* * * * *